(12) United States Patent
Ha et al.

(10) Patent No.: US 9,714,974 B2
(45) Date of Patent: Jul. 25, 2017

(54) DEVICE FOR DETECTING OPEN PHASE OF CONNECTION LINE OF STANDBY TRANSFORMER IN NUCLEAR POWER PLANT BY USING ROGOWSKI COIL

(71) Applicant: KOREA HYDRO & NUCLEAR POWER CO., LTD, Seoul (KR)

(72) Inventors: Che Woong Ha, Daejeon (KR); Do Hwan Lee, Daejeon (KR)

(73) Assignee: KOREA HYDRO & NUCLEAR POWER CO., LTD, Seoul (KR)

( * ) Notice: Subject to any disclaimer, the term of this patent is extended or adjusted under 35 U.S.C. 154(b) by 0 days.

(21) Appl. No.: 14/771,732

(22) PCT Filed: Sep. 1, 2014

(86) PCT No.: PCT/KR2014/008150
§ 371 (c)(1),
(2) Date: Aug. 31, 2015

(87) PCT Pub. No.: WO2015/050323
PCT Pub. Date: Apr. 9, 2015

(65) Prior Publication Data
US 2016/0202306 A1     Jul. 14, 2016

(30) Foreign Application Priority Data

Oct. 2, 2013   (KR) ........................ 10-2013-0118067

(51) Int. Cl.
*G01R 31/02*   (2006.01)
*G01R 19/00*   (2006.01)
(Continued)

(52) U.S. Cl.
CPC ......... *G01R 31/027* (2013.01); *G01R 15/181* (2013.01); *G01R 19/0092* (2013.01); *G01R 19/165* (2013.01); *G01R 31/026* (2013.01)

(58) Field of Classification Search
CPC .. G01R 31/026; G01R 31/027; G01R 19/165; G01R 19/0092; G01R 15/181
See application file for complete search history.

(56) References Cited

U.S. PATENT DOCUMENTS

2008/0172192 A1* 7/2008 Banhegyesi ........... G01R 22/10
  702/61
2010/0052691 A1   3/2010 Fong
(Continued)

FOREIGN PATENT DOCUMENTS

CN   101479904 A   7/2009
CN   201838977 U   5/2011
(Continued)

OTHER PUBLICATIONS

International Search Report issued in PCT/KR2014/008150, mailed Nov. 20, 2014.
(Continued)

*Primary Examiner* — Patrick Assouad
*Assistant Examiner* — Haidong Zhang
(74) *Attorney, Agent, or Firm* — McCarter & English, LLP; Steven G. Davis; David R. Burns

(57) ABSTRACT

Disclosed is a device for detecting an open phase of a connection line of a standby transformer in a nuclear power plant by using a Rogowski coil. A Rogowski coil is provided to a neutral line of a Y connection at the primary side of the standby transformer. An open phase detection unit is provided for determining the generation of an open phase at the primary side and generating a warning signal if a current induced in the Rogowski coil is maintained at a value higher than a preset reference value for a time longer than a preset reference time in a state where a circuit breaker at the secondary side of the standby transformer is open. A main control unit is provided for displaying the warning to an
(Continued)

administrator according to the warning signal provided by the open phase detection part.

3 Claims, 1 Drawing Sheet

(51) Int. Cl.
  *G01R 19/165*   (2006.01)
  *G01R 15/18*    (2006.01)

(56) References Cited

U.S. PATENT DOCUMENTS

| | | | | |
|---|---|---|---|---|
| 2011/0264389 | A1* | 10/2011 | Mynam | G01R 31/086 |
| | | | | 702/58 |
| 2015/0311697 | A1* | 10/2015 | Faxvog | H02H 7/04 |
| | | | | 361/35 |
| 2017/0012423 | A1 | 1/2017 | Arritt et al. | |

FOREIGN PATENT DOCUMENTS

| | | |
|---|---|---|
| CN | 202260397 U | 5/2012 |
| EP | 2352038 A1 | 8/2011 |
| JP | 2001050991 A | 2/2001 |
| JP | 2004297967 A | 10/2004 |
| JP | 2010093897 A | 4/2010 |
| JP | 2012233738 A | 11/2012 |
| KR | 1020110081008 A | 7/2011 |
| KR | 101086455 B1 | 11/2011 |
| KR | 20120035994 A | 4/2012 |

OTHER PUBLICATIONS

Amir, Norouzi: "Open phase conditions in 1-4 transformers analysis and protection algorithm", 2013 66th Annual Conference for Protective Relay Engineers, IEEE, Apr. 8, 2013 (Apr. 8, 2013), pp. 112-125.

Gerald, Johnson et al: "Effect of 1-4 transformer connection and construction on single phasing detection", 2013 36th Annual Conference for Protective Relay Engineers, IEEE, Apr. 8, 2013 (Apr. 8, 2013), pp. 177-188.

Extended European Search Report from related European patent application serial No. 14850788.2 issued May 2, 2017.

\* cited by examiner

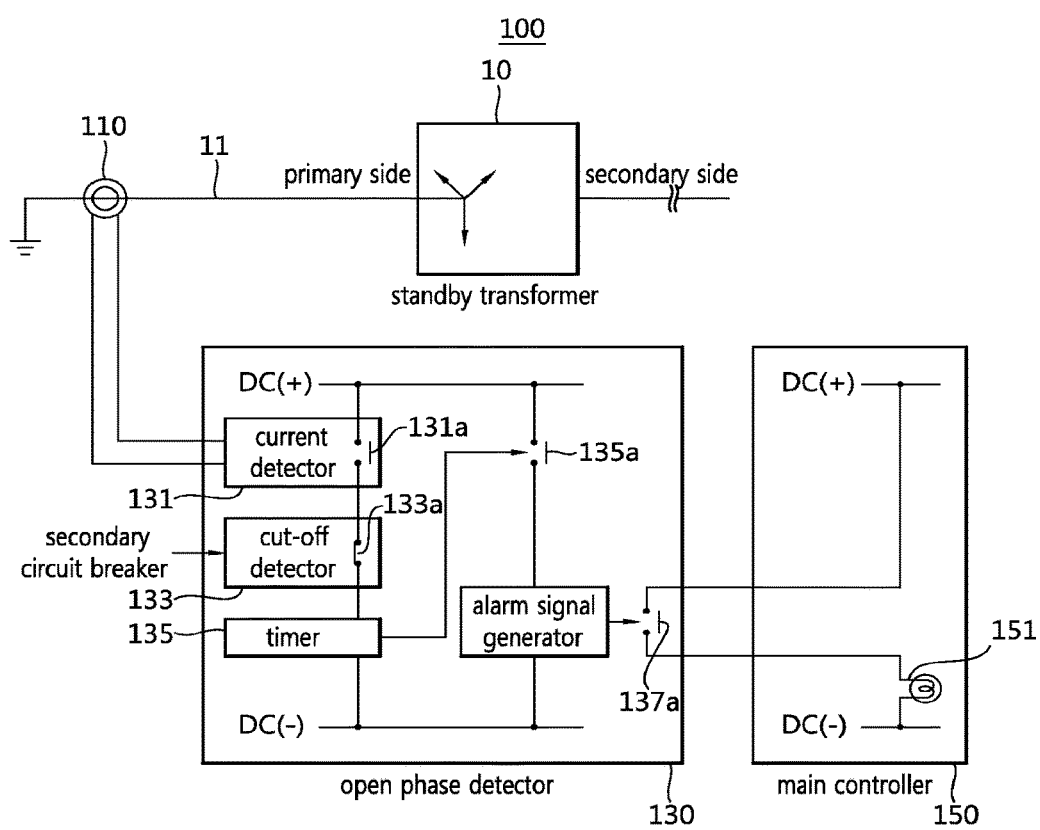

DEVICE FOR DETECTING OPEN PHASE OF CONNECTION LINE OF STANDBY TRANSFORMER IN NUCLEAR POWER PLANT BY USING ROGOWSKI COIL

CROSS-REFERENCE TO RELATED PATENT APPLICATIONS

This application is a 35 U.S.C. §371 national stage filing of International Application No. PCT/KR2014/008150, filed Sep. 1, 2014, which claims the benefit of Korean Patent Application No. 10-2013-0118067, filed Oct. 2, 2013. The contents of each of the foregoing applications are incorporated herein by reference in their entireties.

BACKGROUND

Technical Field

The present invention relates to a device for detecting an open phase in a connection line of a standby transformer in a nuclear power plant using a Rogowski coil.

Background Art

There are not known inventions related to a system for detecting an open phase in a connection line of a transformer yet.

Recently, an open phase is generated due to damage of an insulator of a phase 'C' supporting a primary transmission line of a standby transformer during a normal operation in United States Byron nuclear power plant so that a nuclear reactor is finally stopped. Transient phenomenon occurs for about 8 minutes 2 times due to unbalance degree of power phase in a power plant.

US Nuclear Regulatory Commission reports that similar symptoms are experienced in other power plants from the investigation result.

In the US NRC, with respect to operating nuclear power plants, nuclear power plants under construction as well as the atmospheric models of phase transformers of final design (Design Certification), there is a need to establish a system capable of detecting an open phase of power lines connected to a standby transformer. There is a high probability where Korea Institute of Nuclear Safety (KINS: Korea Institute of Nuclear Safety) requests to establish measures, such as the United States in the future.

A transformer protection relay system in Nuclear power stations which is currently used includes low-voltage relays, overcurrent relays, and differential relays, etc. to be operated. However, the open shape is generated in a connection line of a standby transformer, the transformer protection relay system cannot detect the generation of the open phase. Especially in the case of the standby transformer, when a secondary side is disconnected (open) upon a normal operation so that the open phase is generated in the primary line, it is impossible to detect the generation of the open phase. Furthermore, failure of an off-site electrical system spreads to a power system in a safety rating power plant so that problems such as damage of a power device or shutdown of a nuclear reactor may occur.

SUMMARY OF THE DISCLOSURE

The present invention provides a device for detecting an open phase in a connection line of a standby transformer included in an off-site power system of a nuclear power plant using a Rogowski coil.

In accordance with an aspect of the present invention, there is provided a device for detecting an open phase in a connection line of a standby transformer in a nuclear power plant. The device includes: a Rogowski coil installed at a neutral line of a primary Y connection line in the standby transformer used in the nuclear power plant; an open phase detector which determines that the open phase is generated when the current induced in the Rogowski coil with a preset reference value or greater maintains for a preset reference time or greater in a state that a secondary circuit breaker of the standby transformer is open to generate an alarm signal; and a main controller to display an alarm to a manager according to an alarm signal provided from the open phase detector.

According to an embodiment, the open phase detector may include: a current detector which measures an intensity of the current induced in the Rogowski coil, and closes a contact point-A when the intensity of the current is equal to or greater than the reference value, and opens the contact point-A when the intensity of the current is less than the reference value; a cut-off detector which closes a contact point-B when the secondary circuit breaker of the standby transformer is open, and opens the contact point-B when the secondary circuit breaker of the standby transformer is closed; and a timer which starts an operation when the contact point-A and the contact point-B are closed and closes a contact point-C when the reference time comes; and an alarm signal generator which controls to close a contact point-D corresponding to the alarm signal when the contact-C is closed, wherein the main controller to display the alarm when the contact point-D is closed.

The timer may be serially connected to the contact point-A and the contact point-B between operation power sources DC(+) and DC(−) of the open phase detector, and the alarm signal generator may be serially connected to the contact point-C between the operation power sources DC(+) and DC(−) of the open phase detector.

According to another embodiment, the main controller may include an alarm lamp serially connected to the contact point-D between the operation power sources DC(+) and DC(−) of the main controller.

In the device for detecting an open phase in a connection line of a standby transformer, a current measuring device using a Rogowski coil may be installed in addition to a fault over current relay installed at a neutral line of a Y connection line side in the standby transformer of the nuclear power plant.

In the device for detecting an open phase in a connection line of the standby transformer, the current measuring device measures a current flowing through the Rogowski coil when a secondary circuit breaker in the standby transformer is open. Accordingly, an alarm is generated when a current of a preset value or greater flows through the Rogowski coil for a predetermined time or greater that allows a manager to take suitable measures.

In addition, since the standby transformer is operated when the secondary circuit breaker in the standby transformer is closed, the detection system according to the present invention does not cause serious influence on the system by stopping measurement of a current by the current measurement device.

BRIEF DESCRIPTION OF THE DRAWINGS the FIGURE is a diagram illustrating a device for detecting an open phase in a connection line of a standby transformer in a nuclear power plant.

DETAILED DESCRIPTION

Hereinafter, the present invention will be described with reference to the accompanying drawing.

Referring to the FIGURE, a device 100 for detecting an open phase in a connection line of a standby transformer included in an off-site power system of a nuclear power plant includes a nuclear power plant Rogowski coil 110, an open phase detector 130, and a main controller 150.

First, the Rogowski coil 110 is installed at a neutral line 11 of a Y connection line in a standby transformer 10. Since the Rogowski coil 110 includes an air core having no iron cores, even if a fault over current flows, the Rogowski coil 110 due to thermal stress is not damaged.

According to the related art, a current transformer (not shown) for a fault over current relay may be installed in the neutral line 11 in parallel. The fault over current relay for detecting a fault over current using the current transformer may be installed together.

The open phase detector 130 determines whether an open phase is generated in a primary side of the standby transformer 10 by determining whether an intensity of a current induced in a Rogowski coil 110 maintains with a preset reference value of greater for a preset reference time while a secondary circuit breaker of the standby transformer 10 is open. In a detailed example of the FIGURE, for the above operation, the open phase detector 130 includes a current detector 131, a cut-off detector 133, a timer 135, and an alarm signal generator 137.

The current detector 131 measures an intensity of a current induced in the Rogowski coil 110 to determine whether a corresponding current is equal to or greater than a preset reference value. For example, according to a determination result, when the detected intensity of the current is equal to or greater than a preset reference value, the current detector 131 closes an internal contact point-A 131a. If the detected intensity of the current is less than a preset reference value, the current detector 131 controls to open the internal contact point-A 131a. The present invention includes a plurality of contact points having the internal contact point-A 131a. The above contact point may be realized in various schemes. For example, a relay and the like may be used as the contact point.

The cut-off detector 133 determines whether a secondary circuit breaker (for example, 4.16 kV circuit breaker) of the standby transformer 10 is open. If the secondary side of the standby transformer 10 is disconnected, the cut-off detector 133 connects an internal contact point-B 133a. If the secondary circuit breaker of the standby transformer is closed, the contact point-B 133a is open.

Since the timer 135 is serially connected between operation power sources DC(+) and DC(-) of the open phase detector 130. When both of the contact point-A 131a and the contact point-B 133a are closed, the timer 135 starts the operation. If one the contact point-A 131 a and the contact point-B 133a is open, the operation is reset.

When a preset reference time elapses after starting the operation, (that is, a closed state of the contact point-A 131 a and the contact point-B 133a maintains for a reference time), the timer 135 transfers the result to the alarm signal generator 137 by closing the contact point-C 135a. The result provided from the timer 135 is a case where a current (contact point-A connection) greater than the reference value flows for a reference time or greater through a Rogowski coil while the secondary circuit breaker of the standby transformer is open (contact point-B connection). That is, the result provided from the timer 135 represents 'open phase information' indicating that the open phase is generated in a primary side of the standby transformer 10. In this way, the open phase detector 130 determines whether a current of a preset reference value or greater continuously flows through the Rogowski coil 110 for a preset reference time or greater.

When the current of a preset reference value or greater continuously flows through the Rogowski coil 110 for a preset reference time or greater, the open phase detector 130 determines that an open phase is generated in a primary side of the standby transformer 10. The timer 135 transfers 'open phase information' to the alarm signal generator 137 by controlling to close the contact point-C 135a.

If the secondary circuit breaker of the standby transformer is closed or the current induced in the Rogowski coil 110 is less than a reference value, since one of the contact point-A 131a or the contact point-B 133a is open, the timer 135 stops the operation and is reset. Accordingly, the timer 135 does not provide open phase information to the alarm signal generator 137.

When the alarm signal generator 137 receives open phase information from the timer 135, the alarm signal generator 137 generates an alarm signal to transfer the generated alarm signal to the main controller 150.

In a detailed example of the FIGURE, since the alarm signal generator 137 is serially connected between the operation power sources DC(+) and DC(-) of the open phase detector 130 together with the contact point-C 135a, when the contact-C 135a is closed, the alarm signal generator 137 is operated. When the contact-C 135a is open, the alarm signal generator 137 stops the operation. When the contact-C 135a is closed, the alarm signal generator 137 transfers an alarm signal to the main controller 150 by starting the operation to close the contact-D 137a when the contact-C 135a is closed.

The main controller 150 is provided at a Main Control Room (MCR) to be spaced from the open phase detector 130 around the Rogowski coil 110, and may be connected to the open phase detector 130 through a cable.

The main controller 150 displays an alarm (generation of open shape) to a manager using an alarm lamp, a speaker, and various display devices according to an alarm signal provided from the alarm signal generator 137.

In the example of the FIGURE, since an alarm lamp 151 of the main controller 150 is connected between the operation power sources DC(+) and DC(-) of the main controller 150 together with the contact point-D 137a, if the contact point-D 137a is closed, the alarm lamp 151 irradiates light. If the contact-D 137a is open, the alarm lamp 151 does not irradiate light.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The present invention is applicable to a device for detecting an open phase in a connection line of a standby transformer in a nuclear power plant using the Rogowski coil.

What is claimed is:

1. A device for detecting an open phase in a connection line of a standby transformer in a nuclear power plant, the device comprising:

a Rogowski coil installed at a neutral line of a primary Y connection line in the standby transformer used in the nuclear power plant;

an open phase detector which determines that the open phase is generated when the current induced in the Rogowski coil with a preset reference value or greater maintains for a preset reference time or greater in a state that a secondary circuit breaker of the standby transformer is open to generate an alarm signal; and a main controller to display an alarm to a manager according to an alarm signal provided from the open phase detector, wherein the open phase detector comprises:
  a current detector which measures an intensity of the current induced in the Rogowski coil, and closes a contact point-A when the intensity of the current is equal to or greater than the reference value, and opens the contact point-A when the intensity of the current is less than the reference value;
  a cut-off detector which closes a contact point-B when the secondary circuit breaker of the standby transformer is open, and opens the contact point-B when the secondary circuit breaker of the standby transformer is closed;
  a timer which starts an operation when the contact point-A and the contact point-B are closed and closes a contact point-C when the reference time comes; and
  an alarm signal generator which controls to close a contact point-D corresponding to the alarm signal when the contact-C is closed, wherein the main controller displays the alarm when the contact point-D is closed.

2. The device of claim 1, wherein the timer is serially connected to the contact point-A and the contact point-B between operation power sources DC(+) and DC(−) of the open phase detector, and the alarm signal generator is serially connected to the contact point-C between the operation power sources DC(+) and DC(−) of the open phase detector.

3. The device of claim 1, wherein the main controller comprises an alarm lamp serially connected to the contact point-D between the operation power sources DC(+) and DC(−) of the main controller.

\* \* \* \* \*